United States Patent
Li et al.

(10) Patent No.: US 12,444,605 B2
(45) Date of Patent: Oct. 14, 2025

(54) EPITAXIAL METHODS INCLUDING A HALOBORANE FORMULA FOR GROWING BORON-CONTAINING STRUCTURES HAVING INCREASED BORON CONCENTRATIONS

(71) Applicant: Applied Materials, Inc., Santa Clara, CA (US)

(72) Inventors: Xuebin Li, Sunnyvale, CA (US); Sathya Chary, San Francisco, CA (US); Joe Margetis, Gilbert, AZ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 382 days.

(21) Appl. No.: 17/573,748

(22) Filed: Jan. 12, 2022

(65) Prior Publication Data
US 2023/0223257 A1   Jul. 13, 2023

(51) Int. Cl.
*C30B 25/18* (2006.01)
*C23C 16/02* (2006.01)
(Continued)

(52) U.S. Cl.
CPC .... *H01L 21/02579* (2013.01); *C23C 16/0236* (2013.01); *C23C 16/38* (2013.01);
(Continued)

(58) Field of Classification Search
CPC ......... C30B 25/00; C30B 25/02; C30B 25/16; C30B 25/18; C30B 25/186; C30B 25/20;
(Continued)

(56) References Cited

U.S. PATENT DOCUMENTS 6,958,253 B2   10/2005   Todd
7,132,338 B2   11/2006   Samoilov et al.
(Continued)

FOREIGN PATENT DOCUMENTS

CN   103165664 A   6/2013
JP   S61276367 A   12/1986
WO   2007120866 A2   10/2007

OTHER PUBLICATIONS

International Search Report and Written Opinion dated Nov. 7, 2022 for Application No. PCT/US2022/037348.
(Continued)

*Primary Examiner* — Kenneth A Bratland, Jr.
(74) *Attorney, Agent, or Firm* — Patterson + Sheridan, LLP

(57) ABSTRACT

Embodiments of the present invention generally relate to methods of epitaxially growing boron-containing structures. In an embodiment, a method of depositing a structure comprising boron and a Group IV element on a substrate is provided. The method includes heating the substrate at a temperature of about 300° C. or more within a chamber, the substrate having a dielectric material and a single crystal formed thereon. The method further includes flowing a first process gas and a second process gas into the chamber, wherein: the first process gas comprises at least one boron-containing gas comprising a haloborane; and the second process gas comprises at least one Group IV element-containing gas. The method further includes exposing the substrate to the first and second process gases to epitaxially and selectively deposit the structure comprising boron and the Group IV element on the single crystal.

18 Claims, 5 Drawing Sheets

(51) Int. Cl.
  *C23C 16/38* (2006.01)
  *C30B 29/10* (2006.01)
  *H01L 21/02* (2006.01)
(52) U.S. Cl.
  CPC ............ *C30B 25/186* (2013.01); *C30B 29/10* (2013.01); *H01L 21/02532* (2013.01); *H01L 21/0262* (2013.01); *H01L 21/02636* (2013.01)
(58) Field of Classification Search
  CPC ......... C30B 29/00; C30B 29/02; C30B 29/06; C30B 29/08; C30B 29/10; C30B 29/52; H01L 21/02579; H01L 21/02532; H01L 21/0262; H01L 21/02636
  USPC .......... 117/84, 88–89, 94–97, 105–106, 928, 117/935–937, 939
  See application file for complete search history.

(56) References Cited

U.S. PATENT DOCUMENTS

| | | | |
|---|---|---|---|
| 7,166,528 B2 | 1/2007 | Kim et al. | |
| 7,682,947 B2 | 3/2010 | Brabant et al. | |
| 8,821,635 B2 | 9/2014 | Kouvetakis et al. | |
| 9,929,055 B2 | 3/2018 | Dube et al. | |
| 11,018,003 B2 | 5/2021 | Huang et al. | |
| 2003/0119288 A1* | 6/2003 | Yamazaki | C23C 16/45574 438/565 |
| 2006/0115934 A1 | 6/2006 | Kim et al. | |
| 2007/0044706 A1 | 3/2007 | Kang et al. | |
| 2010/0148217 A1* | 6/2010 | Simonelli | H10D 30/62 438/300 |
| 2011/0124169 A1 | 5/2011 | Ye et al. | |
| 2012/0295417 A1 | 11/2012 | Adam et al. | |
| 2012/0295421 A1 | 11/2012 | Brabant et al. | |
| 2015/0247259 A1 | 9/2015 | Hekmatshoar-Tabari et al. | |
| 2018/0083104 A1* | 3/2018 | Huang | H01L 21/02656 |
| 2020/0051818 A1* | 2/2020 | Aderhold | H01L 21/67167 |

OTHER PUBLICATIONS

Herner, S. B. et al., "Silicon deposition from BCl3/SiH4 mixtures: Effect of very high boron concentration on microstructure," Journal of Vacuum Science & Technology B, 2004, vol. 22, No. 1, pp. 1-5.
International Search Report and Written Opinion for Application No. PCT/US2019/041895 dated Nov. 11, 2019.

* cited by examiner

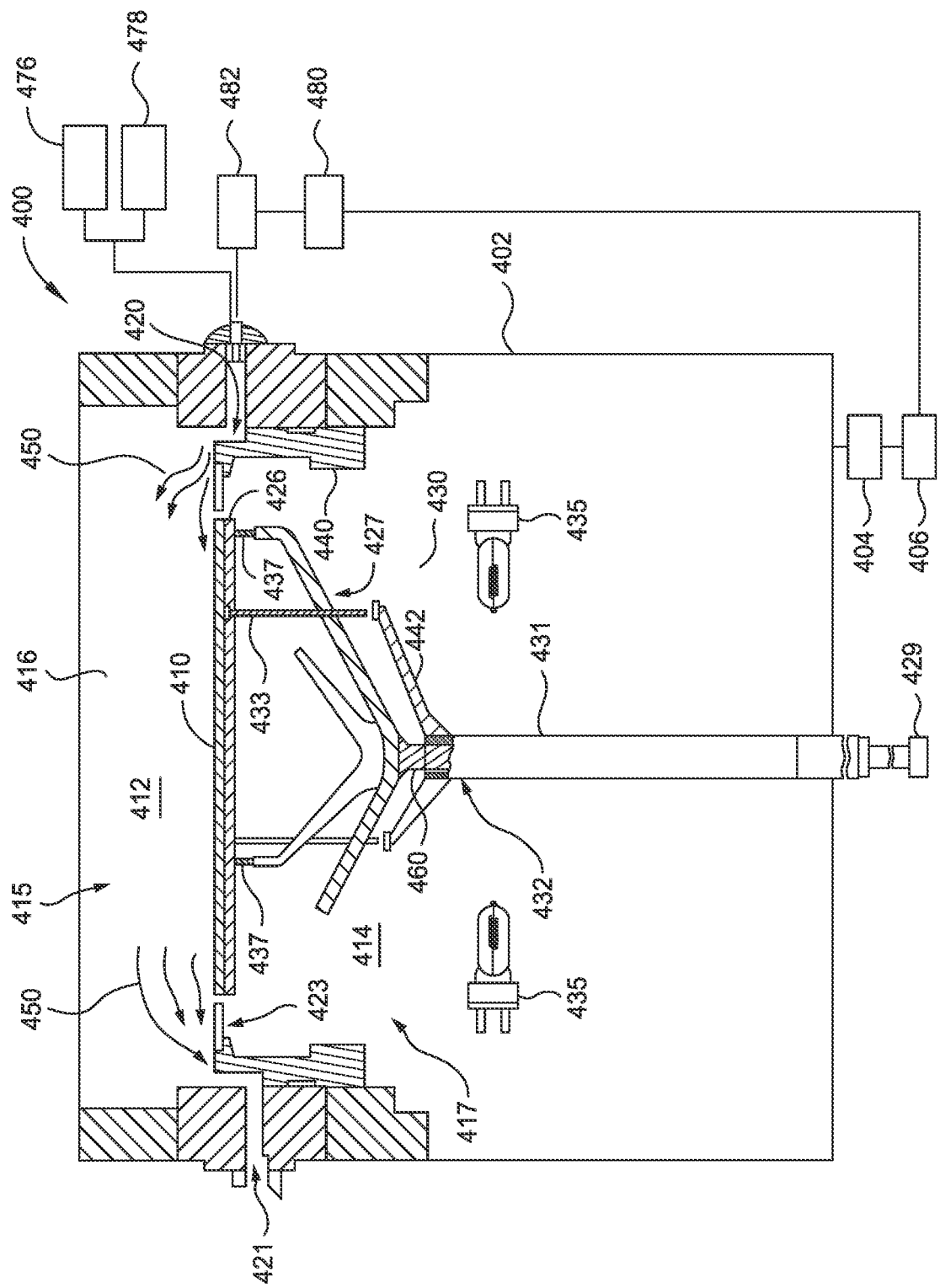

EPITAXIAL METHODS INCLUDING A HALOBORANE FORMULA FOR GROWING BORON-CONTAINING STRUCTURES HAVING INCREASED BORON CONCENTRATIONS

BACKGROUND

Field

Embodiments of the present invention generally relate to methods of epitaxially growing boron-containing structures for use in, e.g., P-channel metal-oxide-semiconductor (pMOS) films.

Description of the Related Art

Selective epitaxial deposition of, e.g., silicon (Si), permits the growth of epitaxial layers on exposed crystalline planes (e.g., Si, Ge, or other semiconductor regions) of a substrate, also known as deposition or depositing of the layers, with no net film growth on exposed dielectric areas of the substrate. Selective epitaxy can be used in the fabrication of semiconductor device structures, such as for forming desired layers in elevated source/drains, source/drain extensions, contact plugs, and base layers of bipolar devices.

The selectivity of an epitaxial process is determined by the sources of elements to be deposited, e.g., the source of boron (B), Si, and/or germanium (Ge) elements, as well as the etchant utilized to suppress film nucleation on dielectric features. With respect to fabrication of pMOS epitaxial films, conventional processes utilize diborane (B2H6) as the source of boron. However, B2H6 decomposes easily upon thermal heating and leads to poor selectivity as the boron deposits on the dielectric areas of the substrate. Such selectivity loss, as well as crystalline film degradation, is worse at high boron source concentrations ($>3 \times 10^{20}$ atoms/cm$^3$). For example, conventional selective SiGeB processes utilizing dichlorosilane (DCS), germane (GeH4), B2H6, and HCl, can achieve boron concentrations in the film up to about $2\text{-}3 \times 10^{20}$ atoms/cm$^3$. To achieve boron concentrations in the film $>3 \times 10^{20}$ atoms/cm$^3$, more B2H6 is utilized. However, higher etchant amounts are required to maintain selectivity. In addition, boron-rich non-epitaxial layers easily form on crystalline Si and SiGe surfaces, which negatively affects pMOS crystalline film growth with time.

There is a need for new and improved methods of depositing boron that overcome these and other deficiencies in the art.

SUMMARY

Embodiments of the present invention generally relate to methods of epitaxially growing boron-containing structures.

In an embodiment, a method of depositing a structure comprising boron and a Group IV element on a substrate is provided. The method includes positioning the substrate within a substrate processing chamber, the substrate having a dielectric material and a single crystal formed thereon, the single crystal comprising a Group IV element; and heating the substrate at a temperature of about 300° C. or more. The method further includes flowing a first process gas and a second process gas into the substrate processing chamber, wherein: the first process gas comprises at least one boron-containing gas, the at least one boron-containing gas comprising a haloborane of formula: $BR^1_nX_{3-n}$, wherein: each $R^1$ is, independently, hydrogen or a $C_1$-$C_6$ alkyl group; each X is a halogen; and n is 0, 1, or 2; and the second process gas comprises at least one Group IV element-containing gas. The method further includes exposing the substrate to the first process gas and the second process gas to epitaxially and selectively deposit the structure comprising boron and the Group IV element on the single crystal, the structure having a boron concentration of about $3 \times 10^{20}$ atoms/cm$^3$ or more.

In another embodiment, a method of epitaxially and selectively growing a structure comprising boron and a Group IV element on a substrate is provided. The method includes positioning the substrate within a substrate processing chamber, the substrate having a dielectric material and a single crystal formed thereon, the single crystal comprising Si, Ge, or a combination thereof; and heating the substrate at a temperature of about 300° C. to about 700° C. The method further includes epitaxially and selectively growing the structure comprising boron and the Group IV element on the single crystal, comprising: flowing a first process gas, a second process gas, and a carrier gas into the substrate processing chamber, wherein: the first process gas comprises at least one boron-containing gas, the at least one boron-containing gas comprising a haloborane having the formula: $BR^1_nX_{3-n}$, wherein: each $R^1$ is, independently, hydrogen or a $C_1$-$C_6$ alkyl group; each X is a halogen; and n is 0, 1, or 2; the second process gas comprises at least one Group IV element-containing gas; and the carrier gas comprises $H_2$, $N_2$, or a combination thereof; and exposing the substrate to the first process gas and the second process gas to epitaxially and selectively grow the structure, the structure having a boron concentration of about $3 \times 10^{20}$ atoms/cm$^3$ or more.

In another embodiment, a method for epitaxially and selectively growing a structure comprising boron and a Group IV element on a substrate is provided. The method includes positioning the substrate within a substrate processing chamber, the substrate having a dielectric material and a single crystal formed thereon; and heating the substrate at a temperature of about 300° C. to about 700° C. The method further includes epitaxially and selectively growing the structure comprising boron and the Group IV element on the single crystal, comprising: flowing a first boron-containing gas into the substrate processing chamber, the first boron-containing gas comprising a haloborane; exposing the substrate with the first boron-containing gas; co-flowing a second boron-containing gas and at least one Group IV element-containing gas into the substrate processing chamber, the first boron-containing gas and the second boron-containing gas being the same or different; and exposing the substrate with the second boron-containing gas and the Group IV element-containing gas to epitaxially and selectively grow the structure, the structure having a boron concentration of about $3 \times 10^{20}$ atoms/cm$^3$ or more.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, which may admit to other equally effective embodiments.

FIG. 4 is a cross-sectional view of an example chamber that may be used to perform epitaxial processes described herein according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
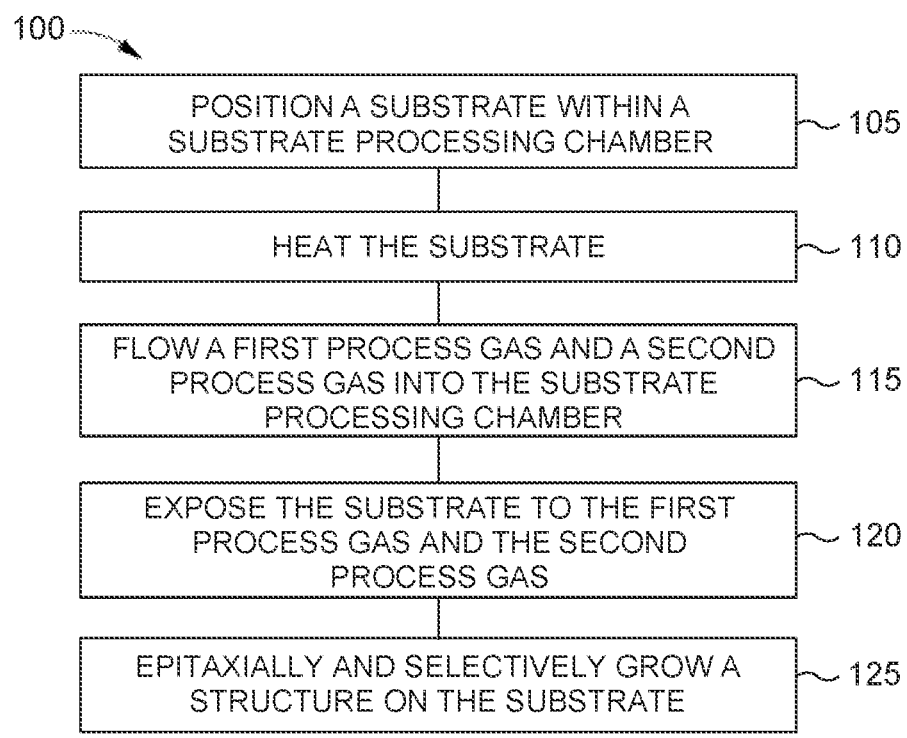
FIG. 1A is a flow chart showing selected operations of an example method of forming a boron-containing structure according to at least one embodiment of the present disclosure.

Embodiments of the present invention generally relate to methods of epitaxially growing boron-containing structures. The methods described herein enable improved selectivity and higher concentrations of dopants (e.g., boron) deposited in, e.g., pMOS films relative to conventional processes. The methods described herein can be utilized for, e.g., 3-nm process nodes, 2-nm process nodes, and source/drain applications. As described above, conventional pMOS processes utilize diborane as a boron source for epitaxial deposition of pMOS films. Such epitaxial deposition processes, however, can suffer from low selectivity and lower-than-desired boron concentrations in the deposited pMOS film. In contrast, and in some examples, methods described herein can utilize a different boron source (e.g., BCl3 and/or other boron sources) as a process gas instead of diborane alone. Utilization of the different boron source can achieve, e.g., better selectivity, better growth rates, and higher boron concentrations in the pMOS films relative to diborane alone, especially meaningful for a variety of applications such as 3-nm process nodes, 2-nm process nodes, and source/drain applications. For example, boron concentrations greater than about $>3 \times 10^{20}$ atoms/cm$^3$, such as greater than $>5 \times 10^{20}$ atoms/cm$^3$ can be achieved by methods described herein, though higher or lower concentrations are contemplated.

As a non-limiting example, the inventors have found that the use of $BCl_3$ enables higher selectivity relative to diborane as $BCl_3$ passivates the dielectric surface (B—Cl bonded) and increases the reaction energy barrier for Group IV element (Si, Ge, etc.) nucleation on dielectric surfaces of the substrate. With respect to passivation of the dielectric surface of the substrate during epitaxial processes, both $BH_x$ and $BCl_x$ form strong bonds to oxide surfaces (e.g., SiO). Once bonded to the oxide surface, the B—H bond of SiO—$BH_2$ weakens whereas the B—Cl bond of SiO—$BCl_2$ strengthens. Here, SiO—$BH_2$ moieties easily dissociate to Si—O—B whereas SiO—$BCl_2$ moieties remain relatively stable, thereby acting to passivate the dielectric surface of the substrate. When comparing the energetics of $B_2H_6$ and $BCl_3$ during epitaxial processing with, e.g., silane ($SiH_4$), $SiH_4$ absorption on SiO—$BH_2$ sites of the dielectric is favored, leading to poor selectivity. In contrast, $SiH_4$ absorption on SiO—$BCl_2$ sites of the dielectric is not favored, leading to improved selectivity. Further, $BCl_3$ is not as thermally active as $B_2H_6$, which reduces the likelihood of forming boron-rich layers on the crystalline planes of the substrate. In addition, more local Cl species forms in the reaction of $BCl_3$ with Group IV element-containing gases on the crystalline surface (e.g., Si, SiGe, SiB, SiGeB, etc.), thereby improving the selectivity and pMOS film crystallinity.

For purposes of the present disclosure, the terms "structure," "coating," "layer," "material," and "film" are used interchangeably such that reference to one includes reference to the others. For example, reference to "structure" includes structure, coating, layer, material, and film unless the context indicates otherwise.

As used herein, a Group IV element of the periodic table of elements refers to carbon (C), silicon (Si), germanium (Ge), tin (Sn), lead (Pb), or combinations thereof. For example, a Group IV element-containing structure can include, e.g., a C-containing structure, a Si-containing structure, a Ge-containing structure, a SiB-containing structure, a SiGeB-containing structure, and/or other structures. Group IV elements are also referred to as Group 14 elements of the periodic table of the elements.

For the purposes of this present disclosure, and unless otherwise specified, the term "alkyl" or "alkyl group" interchangeably refers to a group consisting of hydrogen and carbon atoms only. An alkyl group can be substituted or unsubstituted, saturated or unsaturated, linear or branched, cyclic or acyclic, aromatic or non-aromatic, or combinations thereof. When a number of carbon atoms of an alkyl group is specified herein, it is intended that the number refers to the exact number of carbon atoms, or range of carbon atoms, that is specified. In other words, when a number of carbon atoms (or range thereof) is specified for an alkyl group, it is not intended that the alkyl group comprises that specified number of carbon atoms, but rather that the alkyl group contains the specified number. For example, if an alkyl is specified to have or to contain 1 to 6 carbon atoms, an alkyl group having or containing 8 carbon atoms would not qualify; rather, only an alkyl group that contains 1, 2, 3, 4, 5, or 6 carbon atoms would qualify.

Reference to an alkyl group without specifying a particular isomer (e.g., butyl) expressly discloses all isomers (e.g., n-butyl, iso-butyl, sec-butyl, and tert-butyl). For example, reference to an alkyl group having 4 carbon atoms expressly discloses all isomers thereof. When a compound is described herein such that a particular isomer, enantiomer or diastereomer of the compound is not specified, for example, in a formula or in a chemical name, that description is intended to include each isomer and enantiomer of the compound described individual or in any combination.

"Substituted alkyl" refers to an alkyl, where at least one hydrogen of the alkyl has been substituted with at least one heteroatom or heteroatom-containing group, such as one or more elements from Group 13-17 of the periodic table of the elements, such as halogen (F, Cl, Br, or I), O, N, Se, Te, P, As, Sb, S, B, Si, Ge, Sn, Pb, and the like, such as C(O)R*, C(C)NR*$_2$, C(O)OR*, NR*$_2$, OR*, SeR*, TeR*, PR*$_2$, AsR*$_2$, SbR*$_2$, SR*, SO$_x$ (where x=2 or 3), BR*$_2$, SiR*$_3$, GeR*$_3$, SnR*$_3$, PbR*$_3$, and the like or where at least one heteroatom has been inserted within the alkenyl radical such as one or more of halogen (Cl, Br, I, F), O, N, S, Se, Te, NR*, PR*, AsR*, SbR*, BR*, SiR*$_2$, GeR*$_2$, SnR*$_2$, PbR*$_2$, and the like, where R* is, independently, hydrogen, hydrocarbyl (e.g., $C_1$-$C_{10}$), or two or more R* may join together to form a substituted or unsubstituted completely saturated, partially unsaturated, fully unsaturated, or aromatic cyclic or polycyclic ring structure.

The methods described herein are useful for, e.g., forming, depositing, or growing structures comprising boron and a Group IV element on a substrate. The boron and/or Group IV element formed, deposited, or grown on the substrate may be in the form of a structure, coating, layer, or film. The methods can be useful for the fabrication of FinFETs, traditional planar MOSFETs, pMOS structures, and bipolar transistors, among other structures.

Embodiments of the present disclosure include methods to selectively and epitaxially grow boron-containing and/or Group IV element-containing structures. For example, and when using B-containing and Si-containing process gases, SiB-containing structures grow on exposed regions of crystalline regions of a substrate, and not on exposed regions of dielectric materials on the substrate. Selective SiB containing film growth or deposition may be performed when the substrate surface has exposed thereat more than one material, such as exposed single crystalline silicon surface areas, and features that are covered with dielectric materials such as with SiO and SiN layers. Epitaxial growth or deposition selective to the crystalline silicon surface, while leaving the dielectric features or structures uncoated by the epitaxial deposition material, can be achieved using an etchant (e.g., HCl) during deposition if desired. During deposition, the deposition material forms a crystalline layer on the exposed single crystal, and a polycrystalline or amorphous layer on the exposed dielectric surfaces. If used, the etchant can remove the amorphous or polycrystalline film grown or deposited on the amorphous or polycrystalline features faster than it can remove the epitaxial crystalline film grown or deposited on the exposed crystalline material of the substrate (or the SiB structure never grows on the surface of the dielectric material of the substrate), and thus selective epitaxial net growth or deposition of the SiB structure on the exposed crystalline material of the substrate is achieved.

FIG. 1A is a flow chart showing selected operations of a method 100 of forming, depositing, or growing an epitaxial structure according to at least one embodiment of the present disclosure. The epitaxial structure formed, deposited, or grown includes, e.g., boron and/or a Group IV element.

The method 100 begins with positioning a substrate within a substrate processing chamber at operation 105. The substrate can have a dielectric material on one or more surfaces of the substrate and a single crystal on one or more surfaces of the substrate. The substrate can be any suitable substrate such as semiconductor wafers, such as crystalline and single crystalline silicon (e.g., Si<100> and Si<111>), silicon germanium, doped or undoped silicon or germanium substrates, silicon on insulator (SOI) substrates, III-V group materials, and patterned or non-patterned substrates, having a variety of geometries (e.g., round, square and rectangular) and sizes (e.g., 200 mm OD, 300 mm OD, 400 mm OD). Surfaces and/or substrates include these materials, as well as films, layers and materials with dielectric, conductive and barrier properties and include polysilicon. Dielectric materials on the substrate can include $SiO_2$, SiN, SiON, SiOCN, combinations thereof among other materials. In some examples, the single crystal on the substrate includes a Group IV element.

The method 100 further includes heating the substrate at operation 110. The heating process of operation 110 can include heating the substrate at a temperature of about 250° C. or more 300° C. or more and/or about 800° C. or less, such as from about 350° C. to about 750° C., such as from about 400° C. to about 700° C., such as from about 450° C. to about 650° C., such as from about 500° C. to about 600° C., such as from about 500° C. to about 550° C. or from about 550° C. to about 600° C. In at least one embodiment, the temperature can be about 300° C. to about 700° C. Higher or lower temperatures are contemplated.

In some embodiments, one or more operations of method 100 can be performed at a pressure ranging from about 1 Torr to about 100 Torr, such as from about 5 Torr to about 95 Torr, such as from about 10 Torr to about 90 Torr, such as from about 15 Torr to about 85 Torr, such as from about 20 Torr to about 80 Torr, such as from about 25 Torr to about 75 Torr, such as from about 30 Torr to about 70 Torr, such as from about 35 Torr to about 65 Torr, such as from about 40 Torr to about 60 Torr, such as from about 45 Torr to about 55 Torr, such as from about 45 Torr to about 50 Torr or from about 50 Torr to about 55 Torr. In at least one embodiment, one or more operations of method 100 can be performed at a pressure of about 5 Torr to about 50 Torr, such as from about 5 Torr to about 20 Torr. Higher or lower pressures are contemplated.

A first process gas and a second process gas are then flown into the substrate processing chamber at operation 115. In some examples, a carrier gas and/or an etchant can be flown into the substrate processing chamber before, during, and/or after operation 115. For example, a carrier gas can be co-flown with one or more of the first process gas, the second process gas, and/or the etchant.

In some embodiments, carrier gases can include hydrogen ($H_2$), nitrogen ($N_2$), a noble gas (e.g., He, Ne, Ar, Kr, and/or Xe), or combinations thereof, among others. Carrier gases may be combined in various ratios during some embodiments of the process. Etchants, which can be in gas form, can be employed to remove B-containing and/or Group IV element-containing structures grown on the exposed dielectric materials which may form on the exposed dielectric materials of the substrate in an amorphous or polycrystalline form faster than it can remove the B-containing and/or Group IV element-containing structures grown or deposited on the exposed crystalline silicon in crystalline form, for example on a single crystal material or on a crystalline material, of the substrate. Etchants useful for such purposes during processes described herein include, but are not limited to, HCl, HF, HBr, $Br_2$, $Si_2Cl_6$, $SiCl_4$, $SiHCl_3$, $SiH_2Cl_2$, $CCl_4$, $Cl_2$, $GeCl_4$, $GeHCl_3$, and combinations thereof.

The first process gas includes at least one boron-containing gas. The at least one boron-containing gas includes haloboranes. The haloborane can be the first boron-containing gas. Haloboranes include compounds having the formula (I):

$$BR^1{}_nX_{3-n} \qquad (I),$$

wherein:
each $R^1$ is, independently, hydrogen or a $C_1$-$C_6$ alkyl group (e.g., methyl, ethyl, propyl, butyl, pentyl, hexyl, phenyl, etc.);
each X is, independently, a halogen (e.g., F, Cl, Br, or I); and n is 0, 1, or 2.

The $C_1$-$C_6$ alkyl group can be linear or branched, substituted or unsubstituted, cyclic or acyclic, aromatic or non-aromatic.

Illustrative, but non-limiting, examples of haloboranes include boron trifluoride ($BF_3$), difluoroborane ($BHF_2$), boron trichloride ($BCl_3$), dichloroborane ($BHCl_2$), boron tribromide ($BBr_3$), dibromoborane ($BHBr_2$), boron triiodide ($BI_3$), diiodoborane ($BHI_2$), methyldifluoroborane ($CH_3BF_2$), methyldichloroborane ($CH_3BCl_2$), methyldibromoborane ($CH_3BBr_2$), methyldiiodoborane ($CH_3I_2$), combinations thereof, among others.

In some embodiments, the first process gas can include a second boron-containing gas. Here, the haloborane of formula (I) and the second boron-containing gas can be combined for applications such as boron concentration tuning in a deposited film and selectivity tuning for, e.g., gate-all-around structures (e.g., gate-all-around transistors) having inner spacer regions adjacent to Si open regions. With respect to gate-all-around applications, the epitaxial film can grow from the Si open regions and extend to inner spacer regions (with good wetting between the epitaxial film and inner spacer surface). When the process is over-selective, a gap or a void can form next to the inner spacer surface due to poor wetting with epitaxial film originally grown from Si open regions. Therefore, and in some embodiments, using the first boron-containing gas (i.e., haloborane) with the second boron-containing gas (e.g., $B_2H_6$) at various ratios can enable selection of the proper wetting between epitaxial film and the inner spacer (dielectric) surface without void or gap formation.

The second boron-containing gas can include a borane, an organoborane, combinations thereof, among others. Illustrative but non-limiting, examples of boranes include borane ($BH_3$), diborane ($B_2H_6$), triborane ($B_3H_5$), tetraborane ($B_4H_{10}$), pentaborane(9) ($B_5H_9$), pentaborane(11) ($B_5H_{11}$), hexaborane(10) ($B_6H_{10}$), hexaborane(12) ($B_6H_{12}$), and decaborane(14) ($B_{10}H_{14}$).

Organoboranes (also known as alkyl boranes) include compounds having the formula (II):

wherein:
each $R^2$ is, independently, a $C_1$-$C_6$ alkyl group (such as those described above); and
n is 1, 2, or 3.

Illustrative, but non-limiting, examples of organoboranes include trimethylborane (($CH_3)_3B$), dimethylborane (($CH_3)_2BH$), triethylborane (($CH_3CH_2)_3B$), diethylborane (($CH_3CH_2)_2BH$), tripropylborane (($CH_3CH_2CH_2)_3B$), tributylborane ([$CH_3(CH_2)_3]_3B$), triphenylborane (($C_6H_5)_3B$), combinations thereof, among others.

When performing embodiments of the methods described herein, more than one boron-containing gas can be utilized at the same time or at different times. As a non-limiting illustration, $BCl_3$ can be co-flowed with $B_2H_6$ or $BCl_3$ can be flown before $B_2H_6$.

The second process gas includes a Group IV element of the periodic table of the elements such as C, Si, Ge, Sn, or combinations thereof, such as Si, Ge, or both. In some embodiments, the Group IV element-containing gases can include silanes, germanes, stannanes, halogenated silanes, halogenated germanes, halogenated stannanes, organosilanes, organogermanes, organostannanes, organohalosilanes, organohalogermanes, organohalostannanes, or combinations thereof.

Silanes, germanes, and stannanes include compounds having the formula (III):

wherein:
M is C, Si, Ge, Sn, such as Si or Ge; and
x is a non-zero number, such as 1, 2, 3, or 4.

Illustrative, but non-limiting, examples of silanes and germanes of formula (III) include silane ($SiH_4$), disilane ($Si_2H_6$), trisilane ($Si_3H_8$), tetrasilane ($Si_4H_{10}$), germane ($SiH_4$), digermane ($Si_2H_6$), trigermane ($Si_3H_8$), tetragermane ($Ge_4H_{10}$), and combinations thereof, among others.

Other Group IV element-containing gases that are useful include compounds having the formula (IV):

$$M^2_y R^3_z H_{(2y+2-z)} \qquad (IV),$$

wherein:
$M^2$ is C, Si, Ge, or Sn, such as Si or Ge;
each $R^3$ is, independently, a halogen (e.g., F, Cl, Br, or I) or a $C_1$-$C_6$ alkyl group (such as those described above); and
y is a non-zero number, such as 1, 2, 3, or 4
and z is, independently, a non-zero number, such as 1, 2, 3, 4, 5, 6, 7, 8, 9, or 10.

Compounds of formula (IV) include organohalogens, halogenated silanes, halogenated germanes, halogenated stannanes, halogenated organosilanes, organogermanes, organostannanes, organohalosilanes, organohalogermanes, organohalostannanes, or combinations thereof.

Illustrative, but non-limiting, examples of halogenated silanes of formula (IV) include fluorosilane ($SiH_3F$), difluorosilane ($SiH_2F_2$), trifluorosilane ($SiHF_3$), tetrafluorosilane ($SiF_4$), hexafluorodisilane ($Si_2F_6$), chlorosilane ($SiH_3Cl$), dichlorosilane ($SiH_2Cl_2$), trichlorosilane ($SiHCl_3$), tetrachlorosilane ($SiCl_4$), hexachlorodisilane ($Si_2Cl_6$), bromosilane ($SiH_3Br$), dibromosilane ($SiH_2Br_2$), tribromosilane ($SiHBr_3$), tetrabromosilane ($SiBr_4$), hexabromodisilane ($Si_2Br_6$), iodosilane ($SiH_3F$), diiodosilane ($SiH_2I_2$), triiodosilane ($SiH_{13}$), tetraiodosilane ($SiI_4$), hexaiododisilane ($Si_2I_6$), and combinations thereof, among others. Illustrative, but non-limiting, examples of halogenated germanes of formula (IV) include fluorogermane ($GeH_3F$), difluorogermane ($GeH_2F_2$), trifluorogermane ($GeHF_3$), tetrafluorogermane ($GeF_4$), hexafluorodigermane ($Ge_2F_6$), chlorogermane ($GeH_3Cl$), dichlorogermane ($GeH_2Cl_2$), trichlorogermane ($GeHCl_3$), tetrachlorogermane ($GeCl_4$), hexachlorodigermane ($Ge_2Cl_6$), bromogermane ($GeH_3Br$), dibromogermane ($GeH_2Br_2$), tribromogermane ($GeHBr_3$), tetrabromogermane ($GeBr_4$), hexabromodigermane ($Ge_2Br_6$), iodogermane ($GeH_3F$), diiodogermane ($GeH_2I_2$), triiodogermane ($GeHI_3$), tetraiodogermane ($GeI_4$), hexaiododigermane ($Ge_2I_6$), tin chloride ($SnCl_4$), tin bromide ($SnBr_4$), and combinations thereof, among others.

Illustrative, but non-limiting, examples of organosilanes of formula (IV) include methylsilane (($CH_3)SiH_3$), dimethylsilane (($CH_3)_2SiH_2$), ethylsilane (($CH_3CH_2)SiH_3$), methyldisilane (($CH_3)Si_2H_5$), dimethyldisilane (($CH_3)_2Si_2H_4$) and hexamethyldisilane (($CH_3)_6Si_2$), and combinations thereof, among others. Illustrative, but non-limiting, examples of organogermanes of formula (IV) include methylgermane (($CH_3)GeH_3$), dimethylgermane (($CH_3)_2GeH_2$), ethylgermane (($CH_3CH_2)GeH_3$), methyldigermane (($CH_3)Ge_2H_5$), dimethyldigermane (($CH_3)_2Ge_2H_4$) and hexamethyldigermane (($CH_3)_6Ge_2$), and combinations thereof, among others.

When performing embodiments of the methods described herein, more than one Group IV element-containing gas can be utilized at the same time or at different times. As a non-limiting illustration, $SiH_4$ can be co-flown with $GeH_4$ or $SiH_4$ can be flown before $GeH_4$. In addition, the first process gas (the boron-containing gas) can be flown into the substrate processing chamber before, during, and/or after the second process gas (the Group IV element-containing gas).

Additionally, or alternatively, the second process gas can be flown into the substrate processing chamber before, during, and/or after the first process gas. The first process gas can be co-flown with the second process gas.

The first process gas can be flown into the substrate processing chamber at a flow rate that is about 1 sccm or more and/or about 100 sccm or less, such as from about 1 sccm to about 30 sccm, such as from about 1 sccm to about 10 sccm. A higher or lower flow rate of the first process gas is contemplated. The second process gas can be flown into the substrate processing chamber at a flow rate that is about 10 sccm or more and/or about 1000 sccm or less, such as from about 10 sccm to about 500 sccm, such as from about 10 sccm to about 300 sccm. A higher or lower flow rate of the second process gas is contemplated.

The method 100 further includes exposing or introducing the heated substrate with the first process gas and with the second process gas at operation 120. Operation 120 can occur during and/or after operation 115. The method 100 further includes epitaxially and selectively growing or depositing the structure comprising boron and the Group IV element on the single crystal or the crystalline surface at operation 125. Here, the boron in the epitaxially grown structure comes from the first process gas (boron-containing gas) and the Group IV element(s) in the epitaxially grown structure come from the second process gas (the Group IV element-containing gas).

The epitaxial and selective growth/deposition occurs while the dielectric features of the substrate remain uncoated (or at least relatively uncoated) by the boron and the Group IV containing structure at the end of operation 125. In some examples, the concentration of boron in the structure formed in operation 125 is about $1 \times 10^{19}$ atoms/cm$^3$ or more, such as from about $1 \times 10^{19}$ atoms/cm$^3$ to about $2 \times 10^{21}$ atoms/cm$^3$, such as from about $1 \times 10^{20}$ atoms/cm$^3$ to about $1 \times 10^{21}$ atoms/cm$^3$. Higher or lower concentrations of boron are contemplated. In at least one embodiment, a structure formed by operation 125 includes an amount of Ge that is from about 0 atomic percent (atomic %) to about 100 atomic %, such as from about 10 atomic % to about 70 atomic %, such as from about 30 atomic % to about 60 atomic %. Higher or lower amounts of Ge are contemplated. In at least one embodiment, a structure formed by operation 125 includes an amount of Si that is from about 0 atomic % to about 100 atomic %, such as from about 10 atomic % to about 70 atomic %, such as from about 30 atomic % to about 60 atomic %. Higher or lower amounts of Si are contemplated.

In some examples, a growth rate of the structure (e.g., SiB, SiGeB, etcetera) epitaxially deposited is about 10 Å/min or more, such as from about 10 Å/min to about 150 Å/min, such as from about 40 Å/min to about 120 Å/min, such as from about 60 Å/min to about 100 Å/min. Higher or lower growth rates are contemplated.

Figure 1B:
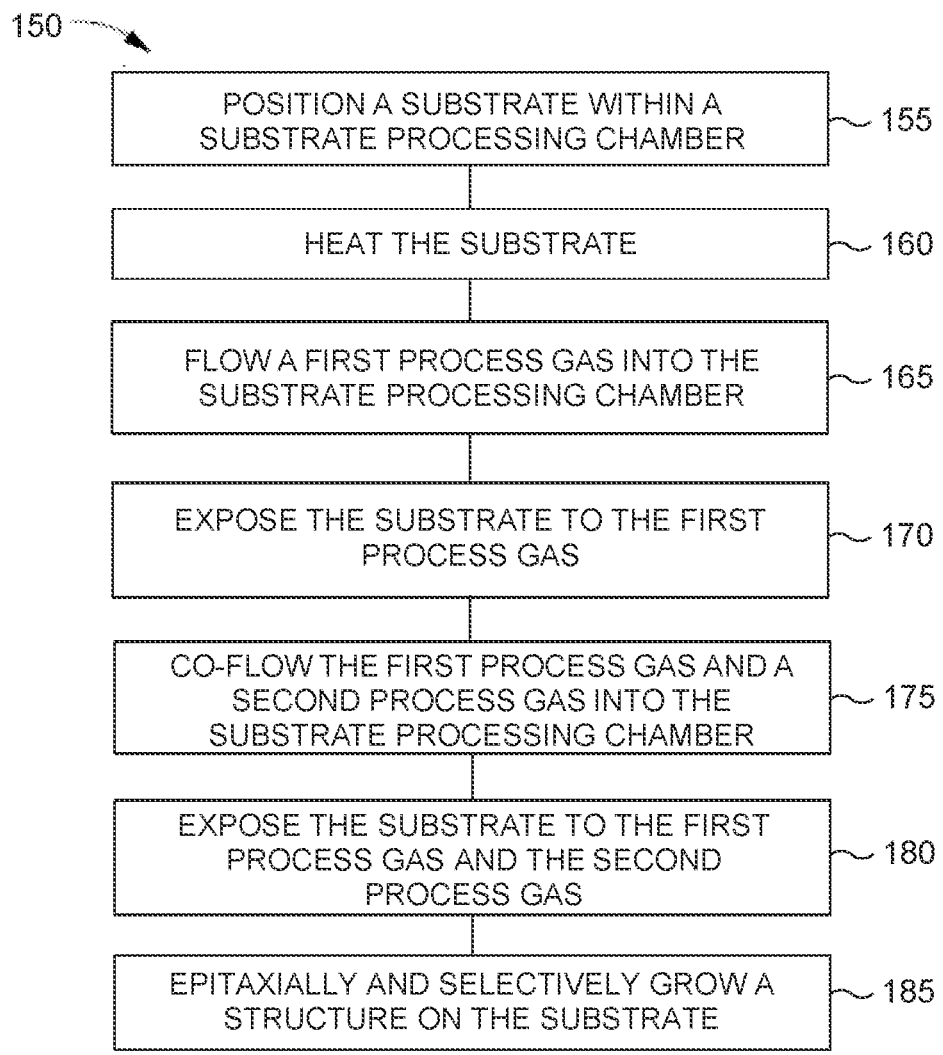
FIG. 1B is a flow chart showing selected operations of an example method of forming a boron-containing structure according to at least one embodiment of the present disclosure.

FIG. 1B is a flow chart showing selected operations of a method 150 of forming, depositing, or growing an epitaxial structure according to at least one embodiment of the present disclosure. The epitaxial structure formed, deposited, or grown includes, e.g., boron and/or a Group IV element. The method 150 shown in FIG. 1B can be performed in the same or similar manner as method 100 except that a boron-containing gas (i.e., the first process gas) is flown into the chamber and introduced with the substrate prior to co-flowing a Group IV element-containing gas with the boron-containing gas.

Method 150 begins with positioning a substrate within the substrate processing chamber and heating the substrate at operations 155 and 160, respectively. Operations 155 and 160 of method 150 can be performed in the same, or a similar manner, as described above with respect to operations 105 and 110 of method 100, respectively. The substrate processing chamber can be operated at pressures described above with respect to method 100 of FIG. 1A. At operations 165 and 170, a first process gas (a boron-containing gas) is flown into the substrate processing chamber and the heated substrate is exposed to the first process gas, respectively. At operations 175 and 180, the first process gas (which can be the same or a different boron-containing gas) and the second process gas are co-flown into the substrate processing chamber and the heated substrate is exposed to the first process gas and the second process gas, respectively. Use of the first process gas prior to the second process gas can help passivate the patterned surface of the substrate, especially the dielectric surface of the substrate. Operations 165, 170, 175, and 180 of method 150 can be performed in the same, or a similar manner, as described above with respect to operations 115 and 120 of method 100, respectively.

The method 150 further includes epitaxially and selectively growing or depositing the structure comprising boron and the Group IV element on the single crystal or the crystalline surface at operation 185. Here, the boron in the epitaxially grown structure comes from the first process gas (boron-containing gas) and the Group IV element(s) in the epitaxially grown structure come from the second process gas (the Group IV element-containing gas).

The epitaxial and selective growth/deposition occurs while the dielectric features of the substrate remain uncoated (or at least relatively uncoated) by the boron and the Group IV containing structure at the end of operation 185. In some examples, the concentration of boron in the structure formed in operation 185 is about $1 \times 10^{19}$ atoms/cm$^3$ or more, such as from about $1 \times 10^{19}$ atoms/cm$^3$ to about $2 \times 10^{21}$ atoms/cm$^3$, such as from about $1 \times 10^{20}$ atoms/cm$^3$ to about $1 \times 10^{21}$ atoms/cm$^3$. Higher or lower concentrations of boron are contemplated. In at least one embodiment, a structure formed by operation 185 includes an amount of Ge that is from about 0 atomic % to about 100 atomic %, such as from about 10 atomic % to about 70 atomic %, such as from about 30 atomic % to about 60 atomic %. Higher or lower amounts of Ge are contemplated. In at least one embodiment, a structure formed by operation 185 includes an amount of Si that is from about 0 atomic % to about 100 atomic %, such as from about 10 atomic % to about 70 atomic %, such as from about 30 atomic % to about 60 atomic %. Higher or lower amounts of Si are contemplated.

In some examples, a growth rate of the structure (e.g., SiB, SiGeB, etcetera) epitaxially deposited is about 10 Å/min or more, such as from about 10 Å/min to about 150 Å/min, such as from about 40 Å/min to about 120 Å/min, such as from about 60 Å/min to about 100 Å/min. Higher or lower growth rates are contemplated.

A first process gas and a second process gas are then flown into the substrate processing chamber at operation 115. In some examples, a carrier gas and/or an etchant can be flown into the substrate processing chamber before, during, and/or after operation 115. For example, a carrier gas can be co-flown with one or more of the first process gas, the second process gas, and/or the etchant.

In some examples, and as described herein, more than one boron-containing gas can be utilized as the first process gas. Here, for example, $BCl_3$ and $B_2H_6$ can be mixed at a certain ratio. For source/drain epitaxial growth on gate-all-around (GAA) structures (e.g., GAA transistors), epitaxial film growth occurs over both the Si surface and the inner spacer (dielectric) surface. The ratio of $BCl_3$ and $B_2H_6$ can be adjusted to tune the selectivity to enable seamless epitaxial film growth over an inner spacer (dielectric) surface without void or gap formation.

Although not shown, further operations may be performed on the substrate. For example, a metal layer can be deposited over the features of the substrate (e.g., a silicon containing single crystal surface, such as the source and drain regions of the substrate) and the substrate and layers formed thereon is thereafter annealed. The metal layer can include, e.g., cobalt, nickel or titanium, among other metals. During an annealing process, the silicon compound layer can be converted to metal silicide layers. For example, when a metal (e.g., cobalt) is deposited as the metal layer, the resulting metal silicide layer is cobalt silicide.

The processes described herein can be used to form, deposit, or grow films used for pMOS, Bipolar (e.g., base, emitter, collector, emitter contact), BiCMOS (e.g., base, emitter, collector, emitter contact) and traditional planar or FinFET CMOS (e.g., channel, source/drain, source/drain extension, elevated source/drain, substrate, strained silicon, silicon on insulator and contact plug). Other embodiments of processes teach the growth of silicon films that can be used as gate, base contact, collector contact, emitter contact, elevated sources/drains, and other uses. Other devices include field effect transistors (FET).

In processes of the present disclosure, boron-containing compounds (e.g., films, layers, and materials) are grown or deposited by chemical vapor deposition (CVD) processes, wherein CVD processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire CVD (HWCVD), reduced-pressure CVD (RP-CVD), and ultrahigh vacuum CVD (UHV-CVD). The processes of the present disclosure can be carried out in equipment known in the art of ALE, CVD and ALD processing. The apparatus brings the various gas(es) into contact with a substrate on which the boron-containing and Group IV element-containing structures are grown. An exemplary epitaxy chamber that may be used to grow the boron-containing and Group IV element-containing structures described herein is a Centura® RP EPI chamber available from Applied Materials, Inc., of Santa Clara, California One exemplary epitaxy chamber is shown in FIG. 4, and described below.

Figure 2:
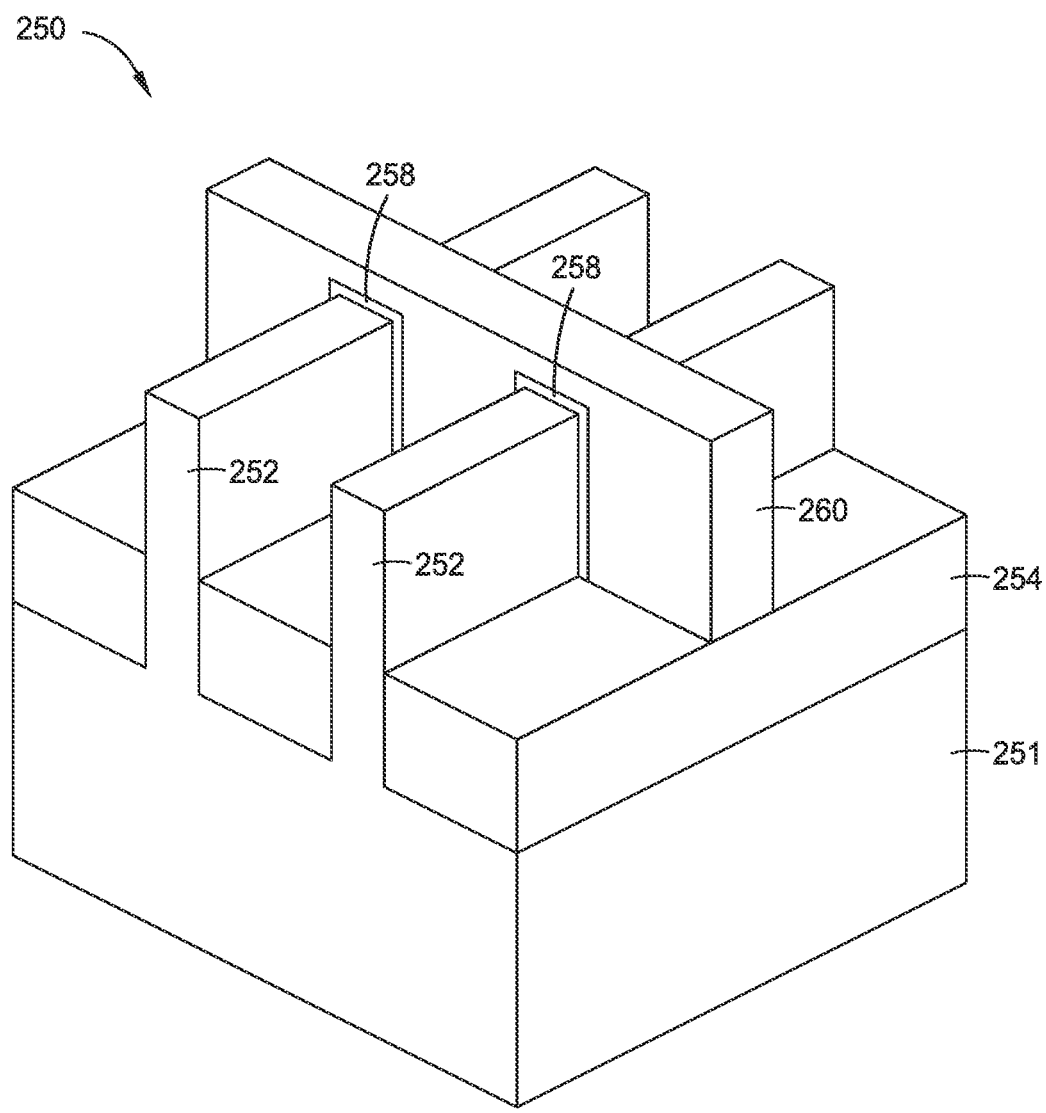
FIG. 2 shows a fin field effect transistor (FinFET) device with an epitaxially deposited silicon-containing layer according to at least one embodiment of the present disclosure.

Various structures can be formed, deposited, or grown via methods described herein. FIG. 2 shows an isometric view of a FinFET semiconductor structure 250, the features of which may be epitaxially grown with the first and second process gases according to at least one embodiment described herein. The FinFET semiconductor structure 250 may include a substrate 251, a plurality of fins 252 (only two are shown, but the structure may have more than two fins), a dielectric material 254 disposed between adjacent fins 252 on the substrate 251, and a gate electrode 260 disposed on the dielectric material 254 and over a portion of each fin 252. The substrate 251 may be a bulk silicon substrate. The substrate 251 may be doped with a p-type impurity. The plurality of fins 252 may be fabricated from the same material as the substrate 251. That is, the plurality of fins 252 can be a source/drain epitaxial fin grown by methods described herein.

The dielectric material 254 may form isolation regions, such as shallow trench isolation (STI) regions, and may be fabricated from silicon oxide, silicon nitride, silicon oxynitride, silicon carbonitride, or any other suitable dielectric material. As shown in FIG. 2, each of the plurality of fins 252 extends a distance above the upper surface of the dielectric material 254. A gate dielectric 258 is formed between the gate electrode 260 and the plurality of fins 252. The gate dielectric 258 facilitates electrical isolation between the gate electrode 260 and the plurality of fins 252. The gate dielectric 258 may be fabricated from silicon nitride, silicon oxide, hafnium oxide, hafnium silicon oxynitride, hafnium silicate, hafnium silicon oxide, or any other suitable gate dielectric material. The gate electrode 260 may be fabricated from polysilicon, amorphous silicon, germanium, silicon germanium, metals, or metal alloys.

Figure 3A:
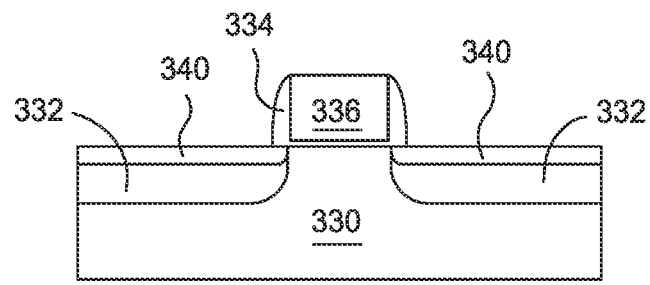
FIG. 3A shows an illustration of a traditional metal-oxide-semiconductor field effect transistor (MOSFET) with epitaxial film at source/drain according to at least one embodiment of the present disclosure.

FIG. 3A depicts a cross section for a traditional planar MOSFET according to some embodiments. After forming a spacer 334 on both sides of a dummy gate 336, a portion of the substrate or of the fin is etched away followed by wet-cleaning of the substrate, to produce a recess within which the boron-containing and Group IV element-containing structure is epitaxially grown according to the methods described herein and for use as the source/drain. The boron-containing and Group IV element-containing structure epitaxially grows to mimic the crystal lattice of the exposed substrate or fin surface and maintains this arrangement as the structure grows with thickness. Subsequent to this source drain formation, and after several intermediate steps, the dummy gate 336 is eventually replaced with an actual metal gate electrode.

An epitaxial structure 332 is selectively deposited within the source/drain region according to embodiments described herein. Selective growth of the epitaxial structure 332 may be performed when a substrate surface 330 has exposed thereat more than one material, such as exposed single crystalline silicon surface areas, and features that are covered with dielectric materials such as with SiO and SiN layers. The epitaxial structure 332 is composed of, for example, doped SiGe containing layers located to either side of the gate in the device depicted by FIG. 3A and having a germanium concentration of, for example, about 0 atomic % to about 100 atomic %, such as from about 10 atomic % to about 70 atomic %, such as from about 30 atomic % to about 60 atomic %. The epitaxial structure 332 can also include a dopant (boron) concentration of, e.g., about $1 \times 10^{19}$ atoms/$cm^3$ or more, such as from about $1 \times 10^{19}$ atoms/$cm^3$ to about $2 \times 10^{21}$ atoms/$cm^3$, such as from about $1 \times 10^{20}$ atoms/$cm^3$ to about $1 \times 10^{21}$ atoms/$cm^3$.

In some embodiments, a boron-doped SiGe structure 340 can, using the methods described herein, be formed on top of an existing B-doped SiGe source/drain layer (e.g., epitaxial structure 332) to form a contact layer. This contact layer reduces the Schottky barrier between B-doped SiGe source/drain and the metal electrode, and provides lower contact resistivity. In this embodiment, the existing B-doped SiGe source/drain can be made by the same or similar methods described herein, or by other methods.

Figure 3B:
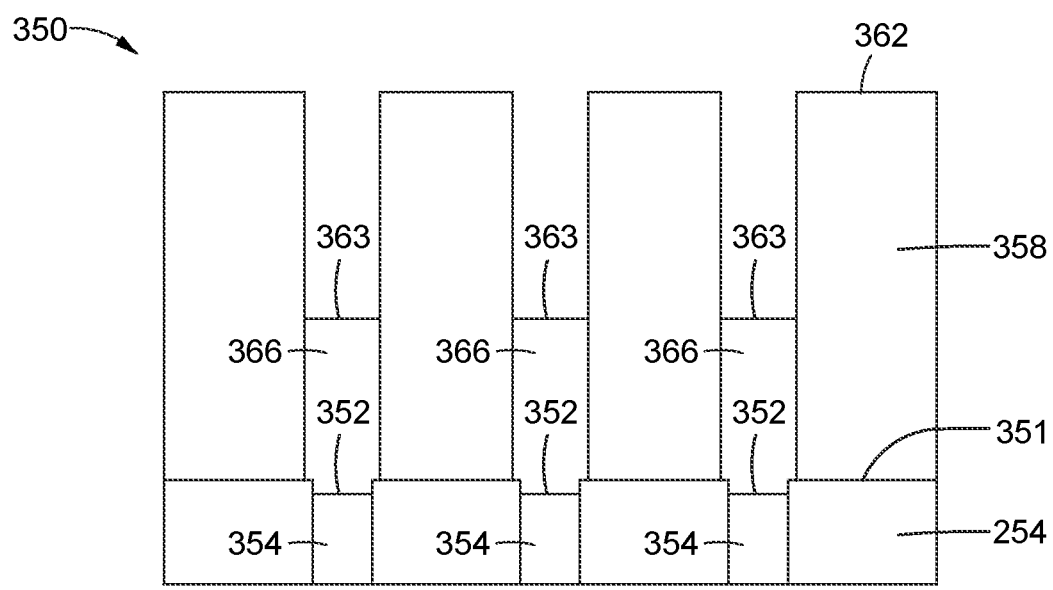
FIG. 3B shows an illustration of a FinFET with epitaxial film at source/drain according to some embodiments of the present disclosure.

FIG. 3B depicts the cross section for a FinFET 350 according to some embodiments. For FinFET source/drain epi film which can be grown by methods described herein, a dielectric material 358 is utilized as a sidewall to confine an epitaxial structure 366 (or epitaxial film). The epitaxial structure 366 grown by methods described herein is a plurality of fins (the plurality of fins can correspond to the plurality of fins 252 of FIG. 2).

As shown in FIG. 3B, the epitaxial structure 366 is deposited on a surface 352 of a substrate 354 and extending over an upper surface 351 of the dielectric material 254 (the dielectric material 254 is also shown in FIG. 2). Each epitaxial structure 366 has a surface 363 that is recessed from a surface 362 of the dielectric material 358. The epitaxial structure 366 may also be deposited on the surface 362 of the dielectric material 358, and an etch back process may be performed to remove the epitaxial structure 366 deposited on the surface 362 of the dielectric material 358. The epitaxial structure 366 may be the source or drain of a FinFET device and may be a boron and Group IV element-containing material. The epitaxial structure 366 may be formed by an epitaxial deposition process described herein in an epitaxial process chamber available from Applied Materials, Inc. In one embodiment, the epitaxial structure 366 is silicon doped with boron and the FinFET device is a p-type FET. In another embodiment, the epitaxial structure 366 is silicon germanium doped with boron, and the FinFET device is a p-type FET.

The epitaxial structure 366 is selectively grown within the source/drain region according to embodiments described herein. Selective growth may be performed when the substrate surface has exposed thereat more than one material, such as exposed single crystalline silicon surface areas, and features that are covered with dielectric materials such as with SiO and SiN layers. The epitaxial structure 366 is composed of, for example, doped SiGe containing layers located to either side of the gate in the device depicted by FIG. 3B and having a germanium concentration of, for example, about 0 atomic % to about 100 atomic %, such as from about 10 atomic % to about 70 atomic %, such as from about 30 atomic % to about 60 atomic %. The epitaxial structure 366 can also include a dopant (boron) concentration of, e.g., about $1\times10^{19}$ atoms/cm$^3$ or more, such as from about $1\times10^{19}$ atoms/cm$^3$ to about $2\times10^{21}$ atoms/cm$^3$, such as from about $1\times10^{20}$ atoms/cm$^3$ to about $1\times10^{21}$ atoms/cm$^3$.

FIG. 4 is a cross-sectional view of a substrate processing chamber 400 that may be used to perform one or more operations of the methods described herein. It is contemplated that other processing chambers can be utilized.

The substrate processing chamber 400 includes a chamber body 402, support systems 404, and a controller 406. The chamber body 402 includes an upper portion 412 and a lower portion 414. The upper portion 412 includes the area within the chamber body 402 between the upper dome 416 and a substrate 410. The lower portion 414 includes the area within the chamber body 402 between a lower dome 430 and the bottom of the substrate 410. Deposition processes generally occur on the upper surface of the substrate 410 exposed to and within the upper portion 412.

The support system 404 includes components used to execute and monitor pre-determined processes, such as the growth or deposition of thin films in the substrate processing chamber 400 as described herein. The controller 406 is coupled to the support system 404 and is adapted to control the substrate processing chamber 400 and support system 404. The controller 406 includes a central processing unit (CPU), a memory, and support circuits.

The substrate processing chamber 400 includes a plurality of heat sources, such as lamps 435, which are adapted to provide thermal energy to components positioned within the substrate processing chamber 400. For example, the lamps 435 may be adapted to provide thermal energy to the substrate 410, a susceptor 426 for supporting a substrate in the substrate processing chamber 400, and/or a preheat ring 423. The lower dome 430 may be formed from an optically transparent material, such as quartz, to facilitate the passage of thermal radiation therethrough. It is contemplated that lamps 435 may be positioned to provide thermal energy through the upper dome 416 as well as through the lower dome 430.

The chamber body 402 includes a plurality of plenums formed therein. The plenums are in fluid communication with one or more gas sources 476, such as a carrier gas, and one or more precursor sources 478, such as process gases (e.g., Group IV element-containing gases and boron-containing gases). For example, a first plenum 420 may be adapted to provide a process gas 450 therethrough into the upper portion 412 of the chamber body 402, while a second plenum 421 may be adapted to exhaust the process gas 450 from the upper portion 412. In such a manner, the process gas 450 may flow parallel to an upper surface of the substrate 410.

In cases where a liquid precursor (e.g., tetrasilane) is used, the substrate processing chamber 400 may include a liquid vaporizer 482 in fluid communication with a liquid precursor source 480. The liquid vaporizer 482 is to be used for vaporizing liquid precursors to be delivered to the substrate processing chamber 400. While not shown, it is contemplated that the liquid precursor source 480 may include, for example, one or more ampoules of precursor liquid and solvent liquid, a shut-off valve, and a liquid flow meter (LFM). As an alternative to the liquid vaporizer, a bubbler may be used to deliver the liquid precursor(s) to the chamber. In such cases, an ampoule of liquid precursor is connected to the process volume of the chamber through a bubbler.

A substrate support assembly 432 is positioned in the lower portion 414 of the chamber body 402. The substrate support assembly 432 is illustrated supporting a substrate 410 in a processing position. The substrate support assembly 432 includes a susceptor support 427 formed from an optically transparent material and the susceptor 426 supported by the susceptor support 427. Support pins 437 couple the susceptor support 427 to the susceptor 426. A shaft 460 of the susceptor support 427 is positioned within a shroud 431 to which lift pin contacts 442 are coupled. The susceptor support 427 is rotatable in order to facilitate the rotation of the substrate 410 about its center during processing. Rotation of the susceptor support 427 is facilitated by a motor, or a belt and motor (not shown). An actuator 429 is coupled to the susceptor support 427 and is used to lift and retract the shaft in order to raise and lower the support. The shroud 431 is generally fixed in position, and therefore, does not rotate during processing.

Lift pins 433 are disposed through openings (not labeled) formed in the susceptor support 427. The lift pins 433 are vertically actuatable by contact with moveable lift pin contacts 442 and are adapted to contact the underside of the substrate 410 to lift the substrate 410 from a processing position (as shown) to a substrate removal position, and to support a newly loaded substrate from a loading position to the processing position on the susceptor 426. Moving of lift pin contacts 442 up and down, or stationary positioning of them when the susceptor support 427 moves up or down, causes the bottoms of the lift pins 433 to come into contact with the lift pin contacts 442, so that they stop moving downward while the support continues to move downward. The preheat ring 423 is removably disposed on a lower liner 440 that is coupled to the chamber body 402. The preheat ring 423 is disposed around the internal volume of the chamber body 402 and circumscribes the substrate 410 while the substrate 410 is in a processing position. The preheat ring 423 facilitates preheating of a process gas 450 as the process gas 450 enters the chamber body 402 through the first plenum 420 adjacent to the preheat ring 423, and reduces the size of the opening between the upper and lower volumes of the chamber. The central window portion 415 of the upper dome 416 and the bottom portion 417 of the lower dome 430 are formed from an optically transparent material such as quartz.

Etchants can be co-flowed with the process gases to further improve deposition or growth selectivity. The etchants are not limited to hydrogen chloride, and can contain halogen, germanium, and/or silicon in the molecules. In situ doping of the deposited materials can be achieved at the same time by co-flowing dopant-containing species such as $BCl_3$ (for p-type) with the Group IV element-containing gases.

A computer system may perform the instructions provided in a non-transitory computer readable medium. The non-transitory computer readable medium can contain instructions to perform the methods described herein. Alternately, the instructions to perform the methods described herein may be added to the non-transitory computer readable medium. The non-transitory computer readable medium can include instructions that cause a computer system to control a substrate processing apparatus to perform processes described herein. The substrate processing chamber 400 can be a part of the substrate processing apparatus. The computer system can be connected to one or more of the substrate processing chamber 400, to valves that regulate the process gases, carrier gases, etchant gases, et cetera, and to switches that regulate temperature and pressure of the various components of the substrate processing apparatus.

In use, and according to some embodiments, the substrate 410 located on the susceptor 426 is positioned within the substrate processing chamber 400. The substrate is heated by, e.g., preheat ring 423 and/or lamps 435. The process gas 450 (e.g., first process gas and/or second process gas) are flown into the substrate processing chamber 400 through the first plenum 420. Carrier gases and/or etchants can also be flown into the substrate processing chamber 400 through the first plenum 420. Exposure of the heated substrate to the process gases enables formation of a boron-containing and Group IV element-containing structure on the substrate.

Embodiments of the present disclosure can be further understood by the following non-limiting examples. The following examples are put forth so as to provide those of ordinary skill in the art with a complete disclosure and description of how to make and use aspects of the present disclosure, and are not intended to limit the scope of aspects of the present disclosure.

EXAMPLES

Example 1

In a non-limiting example, SiGeB films were epitaxially grown on a substrate having a single crystal and a dielectric material formed thereon. Three different boron source gases (first process gases) were utilized: $B_2H_6$ alone, $BCl_3$ alone, or a mixture of $B_2H_6$ and $BCl_3$. The SiGeB was grown utilizing one of the first process gases, two second process gases ($SiCl_2H_2$ and $GeH_4$), $H_2$ as a carrier gas, and HCl as an etchant. Suitable flow rates of the first process gas, second process gas, etchant, and carrier gas were selected. The substrate was heated at suitable temperatures and the chamber was pressurized at suitable pressures.

When using $B_2H_6$ alone as the first process gas, the selective growth rate of the SiGeB film was determined to be about 11 Å/min. The SiGeB film grown had a boron concentration of about $2\times10^{20}$ atoms/cm$^3$ and a Ge concentration of about 54 atomic %.

Use of $BCl_3$ alone as the first process gas showed significant improvements in the growth rate and the SiGeB film relative to $B_2H_6$ alone. Here, the selective growth rate of the SiGeB film was determined to be about 40 Å/min. The SiGeB film grown had a boron concentration of about $4.3\times10^{20}$ atoms/cm$^3$ and a Ge concentration of about 56 atomic %. Relative to the use of $B_2H_6$ alone, the utilization of $BCl_3$ resulted in a higher selective growth rate while using less HCl etchant and a higher concentration of boron in the formed SiGeB film.

Use of a mixture of $B_2H_6$ and $BCl_3$ as the first process gas also showed significant improvements over $B_2H_6$ alone. Here, the selective growth rate of the SiGeB film was determined to be about 40 Å/min. The SiGeB film grown had a boron concentration of about $5.2\times10^{20}$ atoms/cm$^3$ and a Ge concentration of about 48 atomic %. Relative to the use of $B_2H_6$ alone, utilization of the mixture of $B_2H_6$ and $BCl_3$ resulted in a higher selective growth rate of the SiGeB film while using less HCl etchant and a higher concentration of boron in the resulting SiGeB film. In addition, the SiGeB film grown showed good wetting with the dielectric materials indicating that the SiGeB film remains next to the dielectric surface. This result also indicated that the mixture of $B_2H_6$ and $BCl_3$ can be utilized for gate all around structures.

Example 2

In another non-limiting example, SiGeB pMOS films were epitaxially grown on a substrate having a single crystal and a dielectric material formed thereon. Table 1 shows certain parameters and results of the epitaxial process. The substrate was heated at suitable temperatures and the chamber was pressurized at suitable pressures. Comparative examples are indicated by C.Ex.

TABLE 1

|  | C. Ex. 1 | C. Ex. 2 | Ex. 1 | Ex. 2 | Ex. 3 |
| --- | --- | --- | --- | --- | --- |
| Process parameters |  |  |  |  |  |
| Si source | $SiCl_2H_2$ | $SiH_4$ | $SiCl_2H_2$ | $SiH_4$ | $SiH_4$ |
| Ge source | $GeH_4$ | $GeH_4$ | $GeH_4$ | $GeH_4$ | $GeCl_4$ |
| B source | $B_2H_6$ | $B_2H_6$ | $BCl_3$ | $BCl_3$ | $BCl_3$ |
| Etchant | HCl | HCl | HCl | HCl | — |
| SiGeB film |  |  |  |  |  |
| B concentration, $\times10^{20}$ atoms/cm$^3$ | <3 | — | >5 | >5 | >5 |
| Growth rate, Å/min | <10 | — | >40 | >100 | >100 |

The film of comparative example 1 (C.Ex. 1) showed early nucleation of $B_2H_6$, low growth rates, and low boron concentrations. Comparative example 2 (C.Ex. 2) showed poor selectivity. In contrast, the Examples (Ex. 1, Ex. 2, and Ex. 3) showed significant improvements in the boron concentration and growth rates. For example, each of Ex. 1-3 showed an improvement in boron concentration to about $5 \times 10^{20}$ atoms/cm³. Growth rates also significantly improved to greater than about 40 (Ex. 1) or greater than about 100 (Ex. 2 and Ex. 3). Ex. 3 showed that the process can be free of etchant while still enabling, e.g., high selectivity. The examples also indicated that the methods described herein can be utilized to achieve, e.g., bottom-up growth of SiGeB films, among other advantages.

The methods described herein enable selective growth of boron-doped structures with almost complete selectivity to deposit on crystalline surfaces of the substrate. The methods advantageously provide, e.g., improved boron concentrations and selectivity relative to conventional epitaxial processes. In addition, the methods described herein can be utilized for pMOS-type applications.

As is apparent from the foregoing general description and the specific embodiments, while forms of the embodiments have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a formulation, a composition, an element or a group of elements is preceded with the transitional phrase "comprising," it is understood that we also contemplate the same formulation, composition or group of elements with transitional phrases "consisting essentially of," "consisting of," "selected from the group of consisting of," or "Is" preceding the recitation of the formulation, composition, element, or elements and vice versa, e.g., the terms "comprising," "consisting essentially of," "consisting of" also include the product of the combinations of elements listed after the term.

References cited herein are incorporated by reference herein in their entirety to indicate the state of the art as of their publication or filing date and it is intended that this information can be employed herein, if needed, to exclude specific embodiments that are in the prior art.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise. For example, embodiments comprising "a process gas" include embodiments comprising one, two, or more process gases, unless specified to the contrary or the context clearly indicates only one process gas is included.

While the foregoing is directed to embodiments of the present disclosure, other and further aspects of the disclosure may be devised without departing from the basic scope thereof, and the scope thereof is determined by the claims that follow.

What is claimed is:

1. A method of depositing a structure comprising boron and a Group IV element on a substrate, the method comprising:
   positioning the substrate within a substrate processing chamber, the substrate having a dielectric material and a crystalline material formed thereon, the crystalline material comprising a Group IV element;
   heating the substrate to a temperature of 300° C. or more;
   flowing a first process gas and a second process gas into the substrate processing chamber, wherein:
      the first process gas flows at a flow rate within a range of 1 sccm to 100 sccm, the first process gas comprising a boron-containing gas, and the boron-containing gas consisting of boron trichloride ($BCl_3$);
      the second process gas comprises at least one Group IV element-containing gas; and
   exposing the substrate to the first process gas and the second process gas to epitaxially and selectively deposit the structure comprising boron and the Group IV element on the crystalline material at a growth rate of 100 Å/min or more, the structure having a boron concentration of $5 \times 10^{20}$ atoms/cm³ or more, wherein the first process gas is flown into the substrate processing chamber and is exposed to the substrate prior to flowing the second process gas into the substrate processing chamber.

2. The method of claim 1, further comprising flowing an etchant gas into the substrate processing chamber before flowing the first and second process gases, during the flowing of the first and second process gases into the substrate processing chamber, or both.

3. The method of claim 1, further comprising co-flowing the first process gas and the second process gas into the substrate processing chamber after exposing the substrate to the first process gas.

4. The method of claim 1, wherein a carrier gas is flown into the substrate processing chamber with the first process gas or the second process gas.

5. The method of claim 1, wherein the second process gas comprises Si, Ge, or a combination thereof.

6. A method of epitaxially and selectively growing a structure comprising boron and a Group IV element on a substrate, the method comprising:
   positioning the substrate within a substrate processing chamber, the substrate having a dielectric material and a crystalline material formed thereon, the crystalline material comprising Si, Ge, or a combination thereof;
   heating the substrate at a temperature of 300° C. to 700° C.; and
   epitaxially and selectively growing the structure comprising boron and the Group IV element on the crystalline material, comprising:
      flowing a first process gas, a second process gas, and a carrier gas into the substrate processing chamber, wherein:
         the first process gas flows at a flow rate within a range of 1 sccm to 100 sccm, the first process gas comprises a boron-containing gas, and the boron-containing gas consisting of boron trichloride ($BCl_3$);

the second process gas comprises at least one Group IV element-containing gas; and the carrier gas comprises $H_2$, $N_2$, or a combination thereof; and exposing the substrate to the first process gas and the second process gas to epitaxially and selectively grow the structure at a growth rate of 100 Å/min or greater, the structure having a boron concentration of $5 \times 10^{20}$ atoms/cm$^3$ or more, wherein the first process gas is flown into the substrate processing chamber and is exposed to the substrate prior to flowing the second process gas into the substrate processing chamber.

7. The method of claim 6, further comprising flowing an etchant gas into the substrate processing chamber while epitaxially and selectively growing the structure comprising boron and the Group IV element on the crystalline material.

8. The method of claim 6, wherein the at least one Group IV element-containing gas has the formula:

$M^1_x H_{2x+2}$, or $M^2_y R^3_z H_{(2y+2-z)}$, wherein:

each of $M^1$ and $M^2$ is, independently, Si or Ge;

each $R^3$ is, independently, a halogen or a $C_1$-$C_6$ alkyl group;

x is 1, 2, 3, or 4;

y is 1, 2, 3, or 4; and z is 1, 2, 3, 4, 5, 6, 7, 8, 9, or 10.

9. The method of claim 6, wherein the at least one Group IV element-containing gas comprises a silane, a germane, or a combination thereof having the formula:

$M^1_x H_{2x+2}$, wherein:

$M^1$ is Si or Ge; and x is 1, 2, 3, or 4.

10. The method of claim 6, further comprising co-flowing the first process gas and the second process gas into the substrate processing chamber after flowing the first process gas into the substrate processing chamber and exposing the first process gas to the substrate.

11. A method for epitaxially and selectively growing a structure comprising boron and a Group IV element on a substrate, the method comprising:

positioning the substrate within a substrate processing chamber, the substrate having a dielectric material and a crystalline material formed thereon;

heating the substrate to a temperature of 300° C. to 700° C.; and epitaxially and selectively growing the structure comprising boron and the Group IV element on the crystalline material, comprising:

flowing a first boron-containing gas into the substrate processing chamber, the first boron-containing gas flowing at a flow rate within a range of 1 sccm to 100 sccm, and the first boron-containing gas consisting of boron trichloride ($BCl_3$);

exposing the substrate with the first boron-containing gas;

co-flowing a second boron-containing gas and at least one Group IV element-containing gas into the substrate processing chamber, the first boron-containing gas and the second boron-containing gas being the same; and exposing the substrate with the second boron-containing gas and the Group IV element-containing gas to epitaxially and selectively grow the structure at a growth rate of 100 Å/min or greater, the structure having a boron concentration of $5 \times 10^{20}$ atoms/cm$^3$ or more, wherein the first boron-containing gas is flown into the substrate processing chamber and is exposed to the substrate prior to co-flowing the second boron-containing gas and the at least one Group IV element-containing gas into the substrate processing chamber.

12. The method of claim 11, wherein:

the at least one Group IV element-containing gas comprises silane ($SiH_4$), disilane ($Si_2H_6$), trisilane ($Si_3H_8$), tetrasilane ($Si_4H_{10}$), germane ($SiH_4$), digermane ($Si_2H_6$), trigermane ($SisH_8$), tetragermane ($Ge_4H_{10}$), or combinations thereof.

13. The method of claim 1, wherein the flow rate of the first process gas is within a range of 1 sccm to 30 sccm, the structure has an amount of germanium (Ge) that is from 10 atomic % to 70 atomic %, and the boron concentration is $1 \times 10^{21}$ atoms/cm$^3$ or more.

14. The method of claim 13, wherein the flow rate of the first process gas is within a range of 1 sccm to 10 sccm.

15. The method of claim 6, wherein the flow rate of the first process gas is within a range of 1 sccm to 30 sccm, the structure has an amount of germanium (Ge) that is from 10 atomic % to 70 atomic %, and the boron concentration is $1 \times 10^{21}$ atoms/cm$^3$ or more.

16. The method of claim 15, wherein the flow rate of the first process gas is within a range of 1 sccm to 10 sccm.

17. The method of claim 11, wherein the flow rate of the first process gas is within a range of 1 sccm to 30 sccm, the structure has an amount of germanium (Ge) that is from 10 atomic % to 70 atomic %, and the boron concentration is $1 \times 10^{21}$ atoms/cm$^3$ or more.

18. The method of claim 17, wherein the flow rate of the first process gas is within a range of 1 sccm to 10 sccm.

* * * * *

UNITED STATES PATENT AND TRADEMARK OFFICE
CERTIFICATE OF CORRECTION

| | | |
|---|---|---|
| PATENT NO. | : 12,444,605 B2 | Page 1 of 1 |
| APPLICATION NO. | : 17/573748 | |
| DATED | : October 14, 2025 | |
| INVENTOR(S) | : Xuebin Li et al. | |

It is certified that error appears in the above-identified patent and that said Letters Patent is hereby corrected as shown below:

In the Specification

In Column 8, Line 33, delete "(SiH$_{13}$)," and insert -- (SiHI$_3$), --.

In Column 9, Line 50, delete "etcetera)" and insert -- et cetera) --.

In Column 10, Line 50, delete "etcetera)" and insert -- et cetera) --.

In Column 11, Line 47, delete "California" and insert -- California. --.

In the Claims

In Column 18, Line 24, in Claim 1, delete "(BCl$_3$);" and insert -- (BCl$_3$); and --.

In Column 20, Line 31, in Claim 12, delete "(SisH$_8$)," and insert -- (Si$_3$H$_8$), --.

Signed and Sealed this
Twenty-third Day of December, 2025

John A. Squires
*Director of the United States Patent and Trademark Office*